(12) United States Patent
Hsu et al.

(10) Patent No.: US 7,274,085 B1
(45) Date of Patent: Sep. 25, 2007

(54) CAPACITOR STRUCTURE

(75) Inventors: Tsun-Lai Hsu, Hsin-Chu Hsien (TW);
Ya-Nan Mou, Hsin-Chu (TW); Yu-Yee Liow, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/308,162

(22) Filed: Mar. 9, 2006

(51) Int. Cl.
*H01L 29/00* (2006.01)

(52) U.S. Cl. .............................. 257/532; 257/E23.142; 257/E27.048

(58) Field of Classification Search ................ 257/532, 257/E23.142, E27.048
See application file for complete search history.

(56) References Cited

U.S. PATENT DOCUMENTS

| | | | |
|---|---|---|---|
| 5,583,359 A | 12/1996 | Ng et al. | |
| 6,743,671 B2 * | 6/2004 | Hu et al. | 438/253 |
| 2004/0031982 A1 * | 2/2004 | Devries et al. | 257/307 |
| 2004/0222494 A1 * | 11/2004 | Laws | 257/532 |

* cited by examiner

*Primary Examiner*—Jerome Jackson
*Assistant Examiner*—Mohammad Timor Karimy
(74) *Attorney, Agent, or Firm*—Winston Hsu

(57) ABSTRACT

A capacitor structure has a plurality of stacked conductive patterns, and each conductive pattern has a closed conductive ring, a plurality of major conductive bars arranged in parallel and electrically to the closed conductive ring, and a plurality of minor conductive bars arranged alternately with the major conductive bars and not electrically connected to the closed conductive ring. The major conductive bars and the minor conductive bars of an odd layer conductive pattern are respectively corresponding to the minor conductive bars and the major conductive bars of an even layer conductive pattern.

16 Claims, 7 Drawing Sheets

CAPACITOR STRUCTURE

BACKGROUND OF THE INVENTION

1. Field of the Invention

The present invention relates to a capacitor structure, and more particularly, to a capacitor structure with high capacitance and high matching.

2. Description of the Prior Art

Capacitor, device for storing charges, is normally adopted in various ICs e.g. RFIC and analog circuit. Basically, a capacitor structure includes two parallel electrode plates and an insulator disposed in between the electrode plates. With reference to FIG. 1, FIG. 1 is a schematic diagram of a conventional flat plate capacitor structure. As shown in FIG. 1, the flat plate capacitor 10 includes a substrate 12, a first electrode plate 14 disposed on the substrate 12, a capacitor dielectric layer 16 disposed on the first electrode plate 14, and a second electrode plate 18 disposed on the capacitor dielectric layer 16.

However, the first electrode plate 14, the capacitor dielectric layer 16, and the second electrode plate 18 are stacked up horizontally, and therefore the increase of overlapping region will result in reduction of integration.

U.S. Pat. No. 5,583,359 discloses an interdigitated capacitor structure. With reference to FIG. 2 and FIG. 3, FIG. 2 is an oblique schematic diagram of a conventional interdigitated capacitor structure 30, and FIG. 3 is a cross-sectional view of the interdigitated capacitor structure 30 along a tangent line III-III. As shown in FIG. 2 and FIG. 3, the interdigitated capacitor structure 30 includes a first electrode structure and a second electrode structure. The first electrode structure includes a plurality of vertically stacked first conductive patterns 32, and the second electrode structure includes a plurality of second conductive patterns 34. Each first conductive pattern 32 has a first peripheral conductive bar 321 and a plurality of first conductive fingers 322, and each second conductive pattern 34 has a second peripheral conductive bar 341 and a plurality of second conductive fingers 342. The interdigitated capacitor structure 30 further includes a capacitor dielectric layer 38 (not shown in FIG. 2) disposed in between the first conductive patterns 32 and the second conductive patterns 34, a plurality of first contact plugs 40 disposed in the capacitor dielectric layer 38 between the first peripheral conductive bars 321, and a plurality of second contact plugs 42 disposed in the capacitor dielectric layer 38 between the second peripheral conductive bars 341.

As shown in FIG. 2, the first conductive patterns 32 are connected together with the first contact plugs 40, and the second conductive patterns 34 are connected together with the second contact plugs 42. Therefore, the first conductive patterns 32, the second conductive patterns 34, and the capacitor dielectric layer 38 constitute the conventional interdigitated capacitor structure 30. As shown in FIG. 3, the first conductive fingers 322 are applied with positive voltage, while the second conductive fingers 342 are applied with negative voltage.

In comparison with the flat plate capacitor structure, the conventional interdigitated capacitor structure has higher capacitance. However, the conductive patterns are electrically connected to each other with the contact plugs disposed in the dielectric layer between the peripheral conductive bars, and therefore the capacitance can be improved.

SUMMARY OF THE INVENTION

It is therefore one object of the claimed invention to provide a capacitor structure with high capacitance and matching.

According to the claimed invention, a capacitor structure is provided. The capacitor structure includes a first layer conductive pattern, a second layer conductive pattern disposed above the first layer conductive pattern, a dielectric layer sandwiched between the first layer conductive pattern and the second layer conductive pattern, and a plurality of contact plugs disposed in the dielectric layer for electrically connecting the first layer conductive pattern and the second layer conductive pattern. The first layer conductive pattern includes a first closed conductive ring, a plurality of first major conductive bars arranged in parallel and electrically connected to the first closed conductive ring, and a plurality of first minor conductive bars arranged alternately with the first major conductive bars and not electrically connected to the first closed conductive ring. The second layer conductive pattern includes a second closed conductive ring, a plurality of second major conductive bars arranged in parallel and electrically connected to the second closed conductive ring, and a plurality of second minor conductive bars arranged alternately with the second major conductive bars and not electrically connected to the second closed conductive ring. The first major conductive bars are electrically connected to the second minor conductive bars, and the second major conductive bars are electrically connected to the first minor conductive bars.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
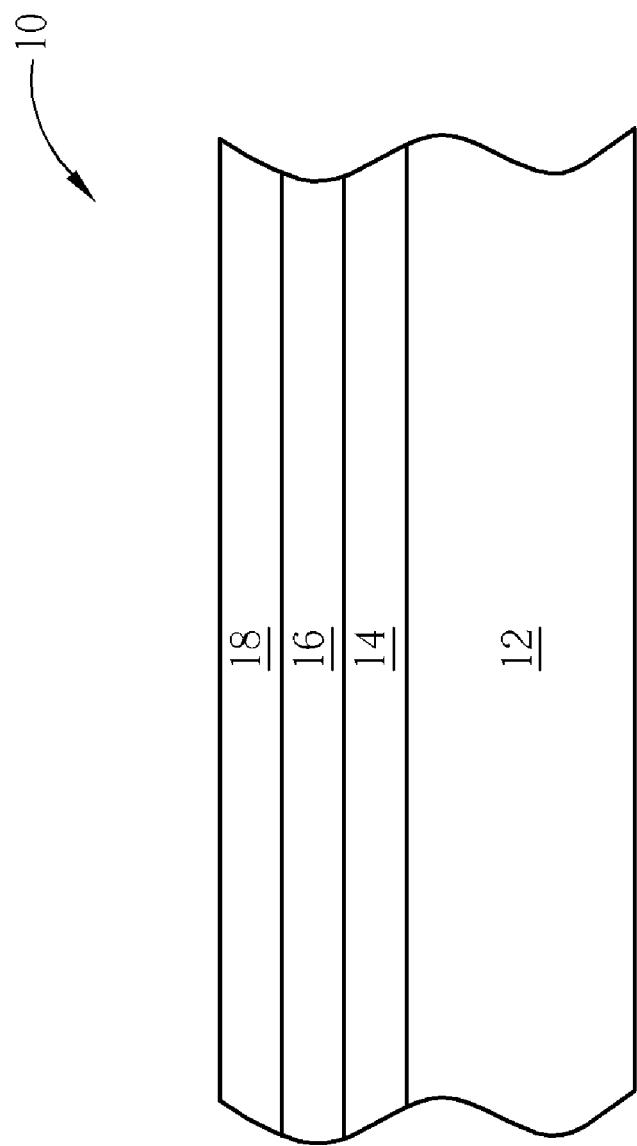
FIG. 1 is a schematic diagram of a conventional flat plate capacitor structure.
Figure 2:
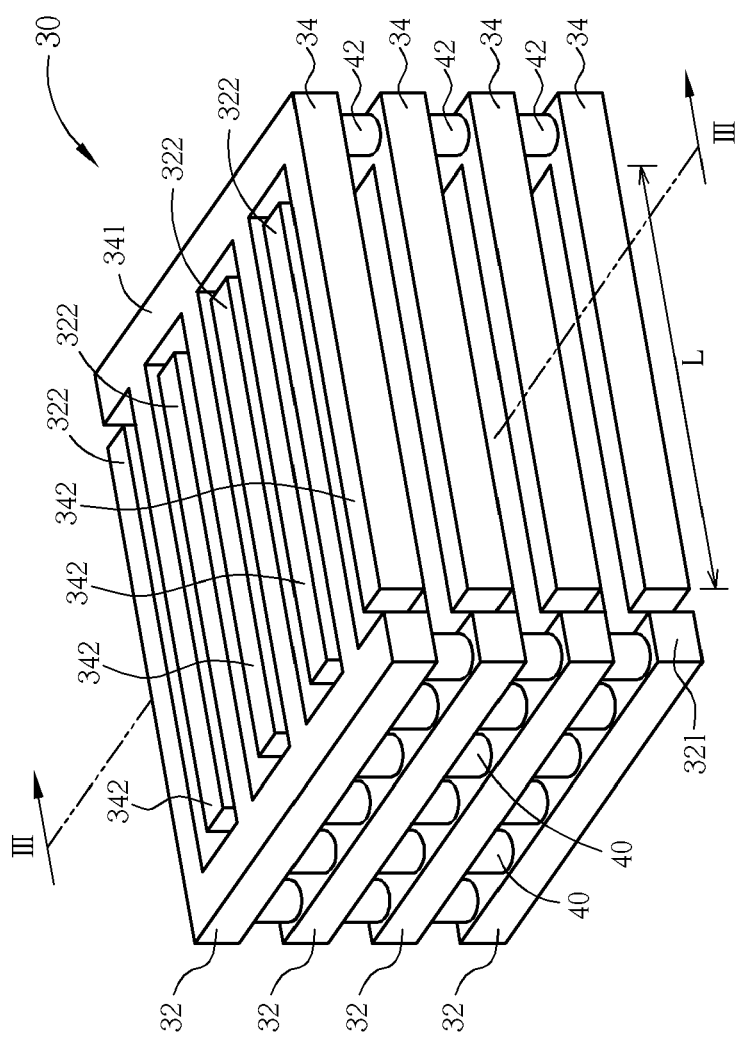
FIG. 2 is an oblique schematic diagram of a conventional interdigitated capacitor structure.
Figure 3:
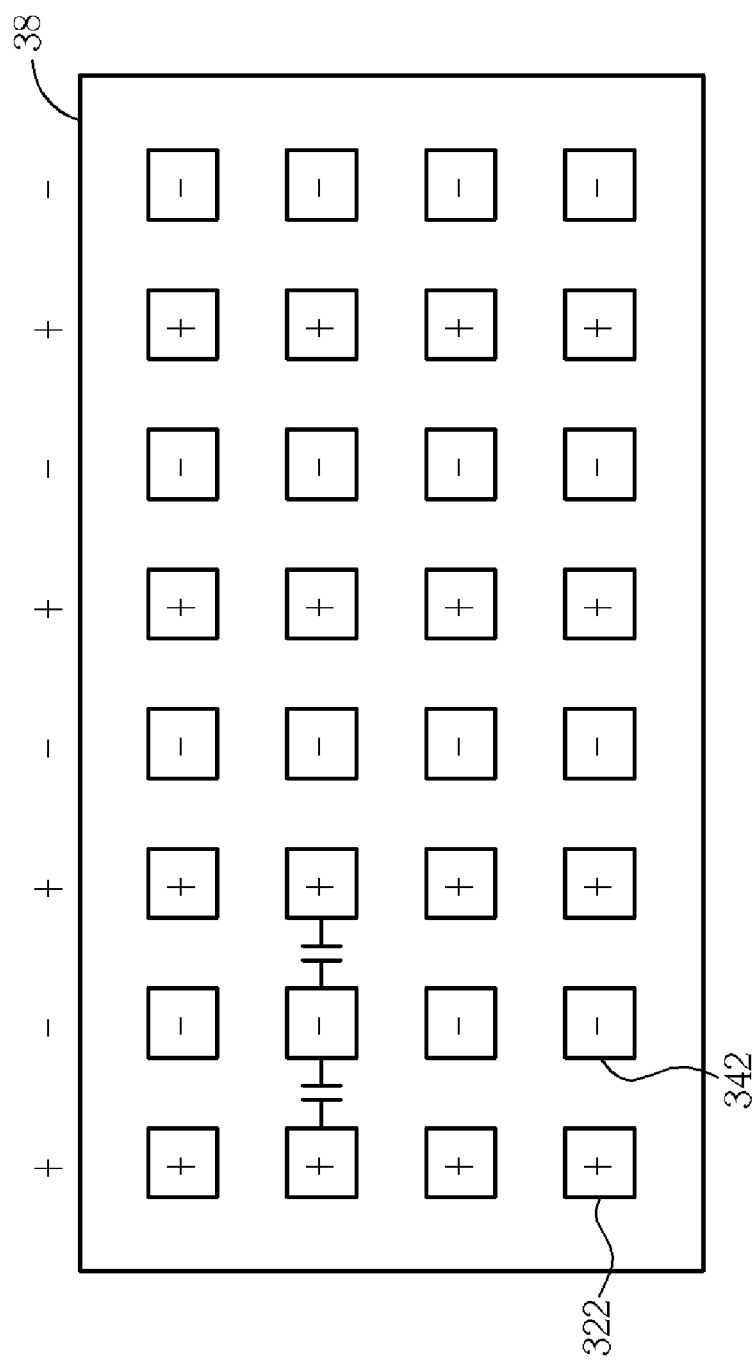
FIG. 3 is a cross-sectional view of the interdigitated capacitor structure along a tangent line III-III.
Figure 4:
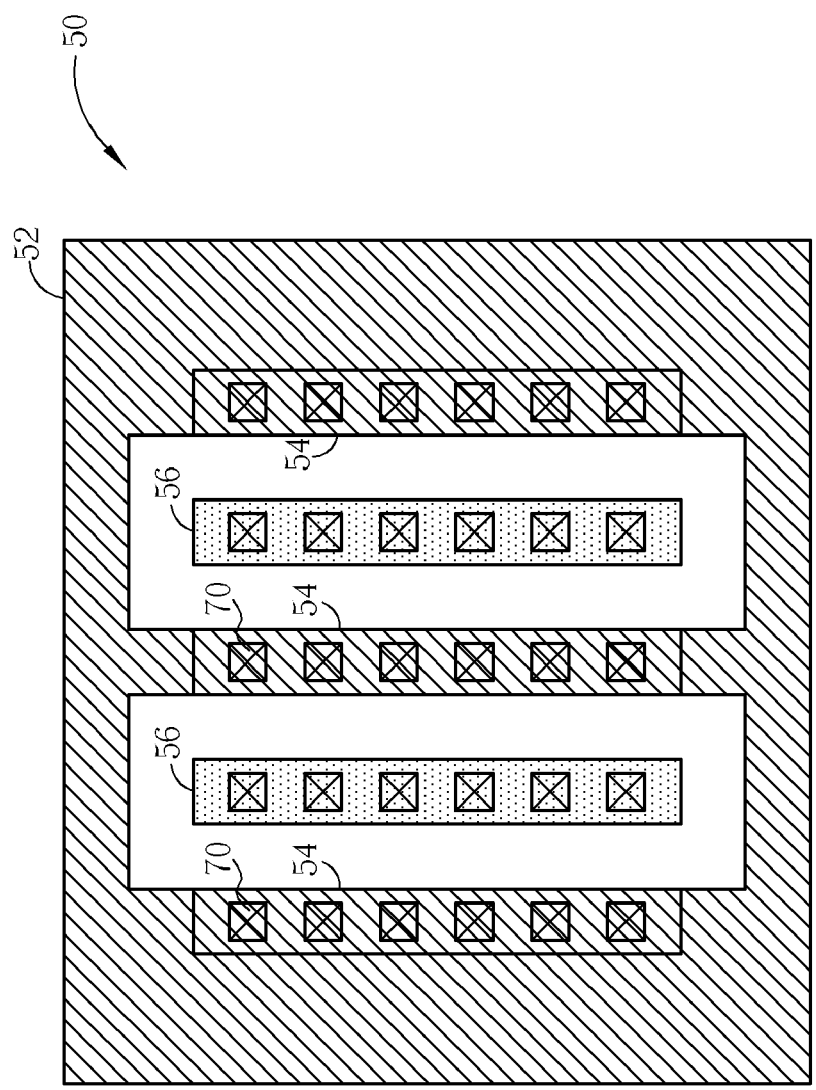
FIG. 4 schematically illustrates a layout pattern of a first layer conductive pattern.
Figure 5:
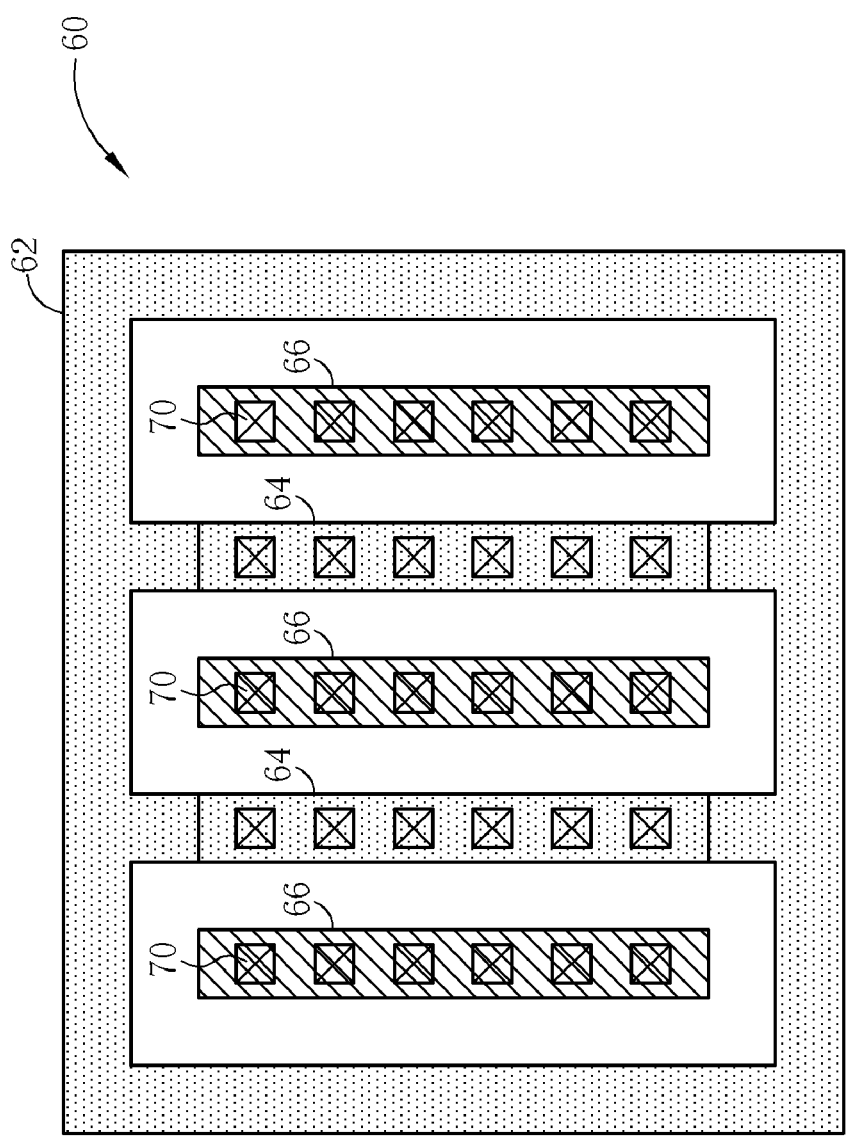
FIG. 5 schematically illustrates a layout pattern of a second layer conductive pattern.

Please reference to FIG. 4 and FIG. 5. FIG. 4 schematically illustrates a layout pattern of a first layer conductive pattern 50, and FIG. 5 schematically illustrates a layout pattern of a second layer conductive pattern 60 in accordance with a preferred embodiment of a capacitor structure. It is appreciated that the capacitor structure of the present invention is not limited to a two-layer structure, and can be a multi-layer structure. For a multi-layer structure, the layout pattern of a conductive pattern of an odd layer is identical to the first layer conductive pattern 50, and the layout pattern of a conductive pattern of an even layer is identical to the second layer conductive pattern 60. As shown in FIG. 4, the first layer conductive pattern 50 includes a first closed conductive ring 52, a plurality of first major conductive bars 54 arranged in parallel and electrically connected to the first closed conductive ring 52, and a plurality of first minor conductive bars 56 arranged alternately with the first major conductive bars 54 and not electrically connected to the first closed conductive ring 52. As shown in FIG. 5, the second layer conductive pattern 60 includes a second closed conductive ring 62, a plurality of second major conductive bars 64 arranged in parallel and electrically connected to the second closed conductive ring 62, and a plurality of second minor conductive bars 66 arranged alternately with the second major conductive bars 64 and not electrically connected to the second closed conductive ring 62.

The capacitor structure of the present invention is fabricated by stacking the first layer conductive pattern 50 and the second layer conductive pattern 60. The first closed conductive ring 52, the first major conductive bars 54, and the first minor conductive bars 56 are respectively corresponding to the second closed conductive ring 62, the second minor conductive bars 66, and the second major conductive bars 64. In addition, the capacitor structure further has a dielectric layer (not shown) sandwiched between the first layer conductive pattern 50 and the second layer conductive pattern 60, and a plurality of contact plugs 70 formed in between the dielectric layer to electrically connect the first major conductive bars 54 and the second minor conductive bars 66, and to connect the second major conductive bars 64 and the first minor conductive bars 56 as well. Furthermore, each of the first layer conductive pattern 50 and the second layer conductive pattern 60 has an I/O port for external connections.

One of the main features of the capacitor structure of the present invention is that each of the closed conductive ring, the major conductive bar, and the minor conductive bar has a symmetric shape, so that the matching of the capacitor structure is improved. As shown in FIG. 4 and FIG. 5, the first closed conductive ring 52 and the second closed conductive ring 62 are rectangular, and the first major conductive bar 54, the first minor conductive bar 56, the second major conductive bar 64, and the second minor conductive bar 66 are stripped in this embodiment. However, the present invention is not limited by the above embodiment, and these components can be modified to any symmetric shapes wherever necessary.

Figure 6:
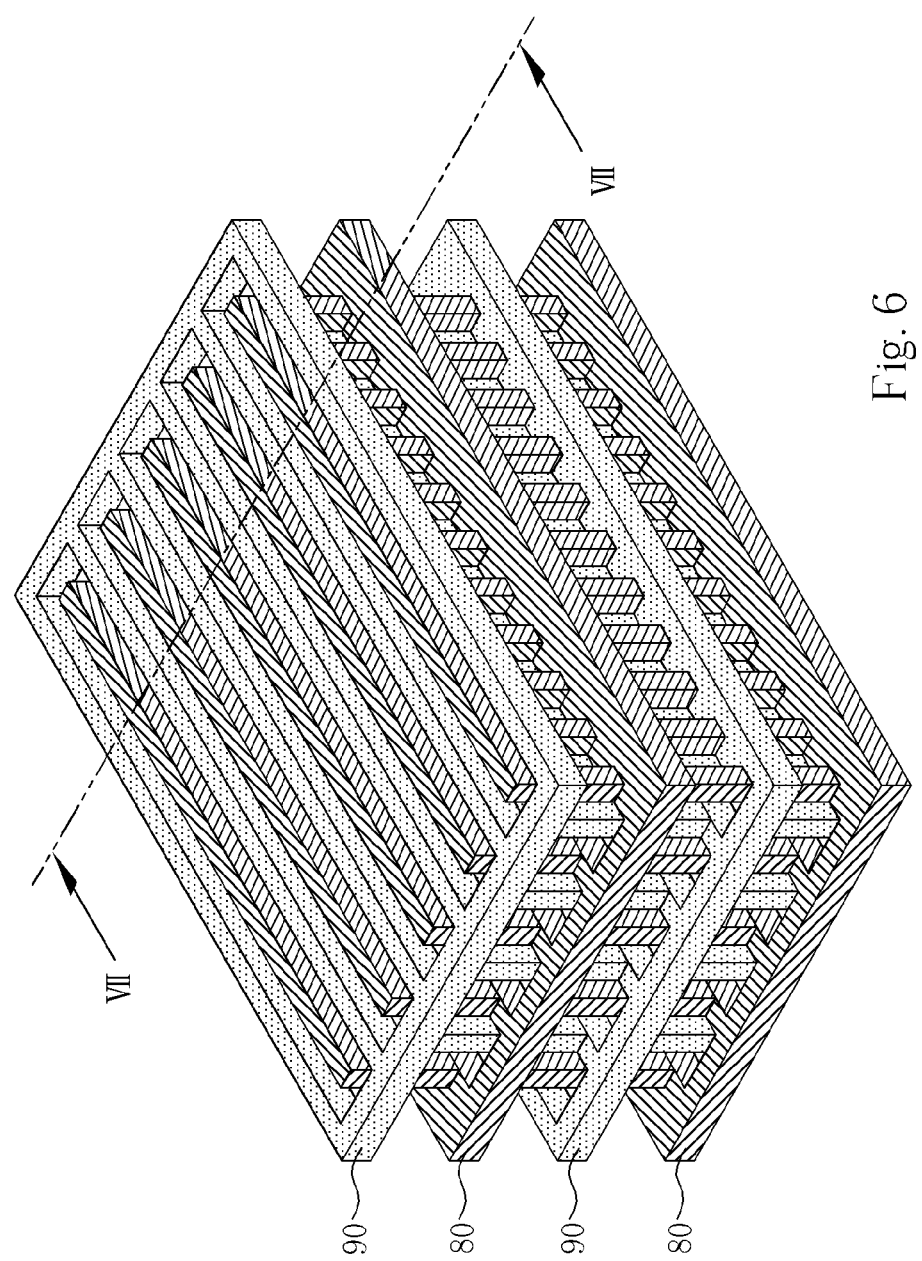
FIG. 6 is an oblique schematic diagram of a capacitor structure in accordance with a preferred embodiment.
Figure 7:
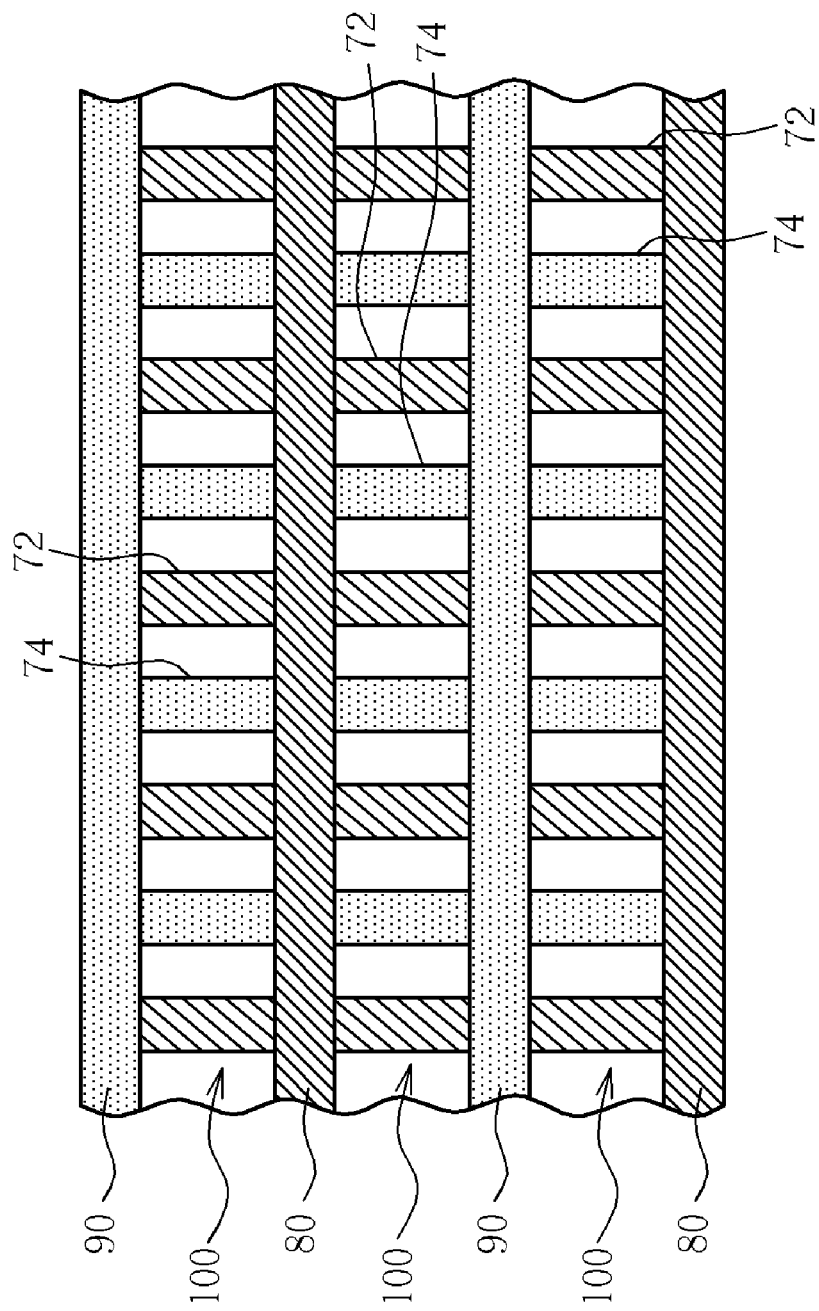
FIG. 7 is a cross-sectional view of the capacitor structure shown in FIG. 6 along a tangent line VII-VII.

Please refer to FIG. 6 and FIG. 7. FIG. 6 is an oblique schematic diagram of a capacitor structure in accordance with a preferred embodiment, and FIG. 7 is a cross-sectional view of the capacitor structure shown in FIG. 6 along a tangent line VII-VII. In this embodiment, a four-layer capacitor structure is illustrated. As shown in FIG. 6 and FIG. 7, the capacitor structure includes a plurality of stacked conductive patterns, where the pattern layouts of the conductive patterns of odd layers (i.e. the first layer and the third layer) 80 are identical to the pattern layout of the first layer conductive pattern 50 (shown in FIG. 4), and the pattern layouts of the conductive patterns of even layers (i.e. the second layer and the fourth layer) 90 are identical to the pattern layout of the second layer conductive pattern 60 (shown in FIG. 5). The capacitor structure has a dielectric layer 100 sandwiched between the conductive patterns 80 and 90, and a plurality of contact plugs disposed in the dielectric layer 100 for connecting the conductive patterns 80 and 90. The contact plugs 72 are used to electrically connect the major conductive bars of the conductive pattern 80 to the minor conductive bars of the conductive pattern 90, and the contact plugs 74 are used to electrically connect the major conductive bars of the conductive pattern 90 to the minor conductive bars of the conductive pattern 80. It is appreciated that the contact plugs 72 and 74 are used to couple the conductive patterns 80 and 90. Thus the shape, size, and arrangement density of the contact plugs 72 and 74 are not limited by the configuration illustrated in FIG. 6 and FIG. 7, and can be modified to obtain an optimal capacitance and matching. In addition, fabrication of the capacitor structure of the present invention can be integrated into the metal interconnection process. In such a case, the conductive pattern can be metal material e.g. aluminum or copper, but the conductive pattern can also be any conductive materials such as polycrystalline silicon. The material of the contact plugs can be tungsten, copper, aluminum, etc. The dielectric layer may be silicon oxide, silicon nitride, silicon oxynitride, or any single or composite dielectric materials.

The capacitor structure has good matching because of the symmetric layout. In addition, the capacitance of the capacitor is contributed by the vertical capacitance between the conductive patterns, the horizontal capacitance between the major conductive bars and the minor conductive bars of each conductive pattern, and the horizontal capacitance between the contact plugs, and therefore the unit capacitance of the capacitor structure can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising:
   a first layer conductive pattern comprising:
      a first closed conductive ring;
      a plurality of first major conductive bars arranged in parallel and electrically connected to the first closed conductive ring; and
      a plurality of first minor conductive bars arranged alternately with the first major conductive bars and not electrically connected to the first closed conductive ring;
   a second layer conductive pattern disposed above the first layer conductive pattern, the second layer conductive pattern comprising;
      a second closed conductive ring;
      a plurality of second major conductive bars arranged in parallel and electrically connected to the second closed conductive ring; and
      a plurality of second minor conductive bars arranged alternately with the second major conductive bars and not electrically connected to the second closed conductive ring;
   a dielectric layer sandwiched between the first layer conductive pattern and the second layer conductive pattern; and
   a plurality of contact plugs disposed in the dielectric layer, comprising a plurality of first contact plugs and a plurality of second contact plugs, wherein each of the first minor conductive bars is electrically connected to the second major conductive bars through at least two of the first contact plugs, and each of the second minor conductive bars is electrically connected to the first major conductive bars through at least two of the second contact plugs.

2. The capacitor structure of claim 1, wherein each of the first closed conductive ring and the second closed conductive ring has a symmetric shape.

3. The capacitor structure of claim 1, wherein each of the first major conductive bars and the second major conductive bars has a symmetric shape.

4. The capacitor of claim 1, wherein each of the first minor conductive bars and the second minor conductive bars has a symmetric shape.

5. The capacitor structure of claim 1, wherein the first layer conductive pattern and the second layer conductive pattern comprise metal or polycrystalline silicon.

6. The capacitor structure of claim 1, wherein the dielectric layer comprises silicon oxide, silicon nitride, or silicon oxynitride.

7. The capacitor structure of claim 1, wherein a capacitance of the capacitor structure is contributed by a vertical capacitance between the first layer conductive pattern and the second layer conductive pattern, a horizontal capacitance between the first major conductive bars and the first minor conductive bars, a horizontal capacitance between the second major conductive bars and the second minor conductive bars, and a horizontal capacitance between the contact plugs.

8. The capacitor structure of claim 1, further comprising a third layer conductive pattern and a fourth layer conductive respectively stacked above the second layer conductive pattern, the third layer conductive pattern, and the first layer conductive pattern having same pattern layouts, and the fourth layer conductive pattern and the second layer conductive pattern having same pattern layouts.

9. A capacitor structure, comprising:
   a plurality of stacked conductive patterns, each conductive pattern comprising a closed conductive ring, a plurality of major conductive bars arranged in parallel and electrically connected to the closed conductive ring, and a plurality of minor conductive bars arranged alternately with the major conductive bars and not electrically connected to the closed conductive ring, wherein the major conductive bars and the minor conductive bars of the conductive pattern of an odd layer are corresponding to the minor conductive bars and the major conductive bars of the conductive pattern of an even layer, and each of the minor conductive bars is longer than its width;
   at least a dielectric layer disposed between the conductive patterns; and
   a plurality of contact plugs disposed in the dielectric layer, wherein the major conductive bars and the minor conductive bars of the conductive pattern of the odd layer are electrically connected to the minor conductive bars and the major conductive bars of the conductive pattern of the even layer with the contact plugs.

10. The capacitor structure of claim 9, wherein each closed conductive ring has a symmetric shape.

11. The capacitor structure of claim 9, wherein each major conductive bar has a symmetric shape.

12. The capacitor structure of claim 9, wherein each minor conductive bar has a symmetric shape.

13. The capacitor stricture of claim 9, wherein each conductive pattern comprises metal.

14. The capacitor structure of claim 9, wherein each conductive pattern comprises polycrystalline silicon.

15. The capacitor structure of claim 9, wherein the dielectric layer comprises silicon oxide, silicon nitride, and silicon oxynitride.

16. The capacitor structure of claim 9, wherein a capacitance of the capacitor structure is contributed by a vertical capacitance between the conductive patterns, a horizontal capacitance between the major conductive bars and the minor conductive bars of each conductive pattern, and a horizontal capacitance between the contact plugs.

* * * * *